(12) United States Patent
DenBaars et al.

(10) Patent No.: US 8,772,792 B2
(45) Date of Patent: Jul. 8, 2014

(54) LED WITH SURFACE ROUGHENING

(71) Applicant: Cree, Inc., Durham, NC (US)

(72) Inventors: Steven P. DenBaars, Goleta, CA (US); Shuji Nakamura, Santa Barbara, CA (US); Max Batres, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/974,505

(22) Filed: Aug. 23, 2013

(65) Prior Publication Data

US 2013/0341663 A1   Dec. 26, 2013

Related U.S. Application Data

(60) Continuation of application No. 12/581,759, filed on Oct. 19, 2009, now Pat. No. 8,541,788, which is a continuation of application No. 11/983,515, filed on Nov. 9, 2007, now Pat. No. 8,410,490, which is a division of application No. 11/042,030, filed on Jan. 24, 2005, now Pat. No. 7,335,920.

(51) Int. Cl.
   *H01L 27/15* (2006.01)
(52) U.S. Cl.
   USPC .......... 257/79; 257/98; 257/99; 257/E33.068; 257/E33.074
(58) Field of Classification Search
   USPC ................. 257/79, 98, 99, E33.068, E33.074
   See application file for complete search history.

(56) References Cited

U.S. PATENT DOCUMENTS

| | | | |
|---|---|---|---|
| 4,864,370 | A | 9/1989 | Gaw et al. |
| 4,946,547 | A | 8/1990 | Palmour et al. |
| 4,990,972 | A | 2/1991 | Satoh et al. |
| 5,153,889 | A | 10/1992 | Sugawara et al. |
| 5,162,878 | A | 11/1992 | Sasagawa et al. |
| 5,200,022 | A | 4/1993 | Kong et al. |
| 5,245,622 | A | 9/1993 | Jewell et al. |
| RE34,861 | E | 2/1995 | Davis et al. |
| 5,404,031 | A | 4/1995 | Sasaki et al. |
| 5,429,954 | A | 7/1995 | Gerner |
| 5,565,694 | A | 10/1996 | Huang et al. |
| 5,719,891 | A | 2/1998 | Jewell |
| 5,779,924 | A | 7/1998 | Krames et al. |

(Continued)

FOREIGN PATENT DOCUMENTS

| | | |
|---|---|---|
| CN | 1215931 A | 5/1999 |
| DE | 4 422 660 | 2/1995 |

(Continued)

OTHER PUBLICATIONS

Chinese Office Action Corresponding to Chinese Patent Application No. 200910224555.3; Date of Issue: Dec. 19, 2012; Foreign Text, 7 Pages, English Translation Thereof, 11 Pages.

(Continued)

*Primary Examiner* — Andy Huynh
(74) *Attorney, Agent, or Firm* — Myers Bigel Sibley & Sajovec, P.A.

(57) ABSTRACT

An LED having a p-type layer of material with an associated p-contact, an n-type layer of material with an associated n-contact and an active region between the p-type layer and the n-type layer, includes a roughened emitting-side surface to further enhance light extraction.

21 Claims, 3 Drawing Sheets

(56) References Cited

U.S. PATENT DOCUMENTS

| | | |
|---|---|---|
| 5,789,768 A | 8/1998 | Lee et al. |
| 5,792,698 A | 8/1998 | Nishitani |
| 5,814,839 A | 9/1998 | Hosoba |
| 6,057,562 A | 5/2000 | Lee et al. |
| 6,133,589 A | 10/2000 | Krames et al. |
| 6,169,296 B1 | 1/2001 | Kamiyama et al. |
| 6,194,743 B1 | 2/2001 | Kondoh et al. |
| 6,242,761 B1 | 6/2001 | Fujimoto et al. |
| 6,258,614 B1 | 7/2001 | Kaneko |
| 6,258,618 B1 | 7/2001 | Lester |
| 6,287,947 B1 | 9/2001 | Ludowise et al. |
| 6,410,942 B1 | 6/2002 | Thibeault et al. |
| 6,420,732 B1 | 7/2002 | Kung et al. |
| 6,420,735 B2 | 7/2002 | Kim |
| 6,455,343 B1 | 9/2002 | Chen et al. |
| 6,468,824 B2 | 10/2002 | Chen et al. |
| 6,469,324 B1 | 10/2002 | Wang |
| 6,486,499 B1 | 11/2002 | Krames et al. |
| 6,492,661 B1 | 12/2002 | Chien et al. |
| 6,514,782 B1 | 2/2003 | Wierer, Jr. et al. |
| 6,521,914 B2 | 2/2003 | Krames et al. |
| 6,534,798 B1 | 3/2003 | Sherer et al. |
| 6,583,443 B1 | 6/2003 | Chang et al. |
| 6,593,160 B2 | 7/2003 | Carter-Coman et al. |
| 6,657,236 B1 | 12/2003 | Thibeault et al. |
| 6,740,906 B2 | 5/2004 | Slater, Jr. et al. |
| 6,744,071 B2 | 6/2004 | Sano et al. |
| 6,784,462 B2 | 8/2004 | Schubert |
| 6,791,119 B2 | 9/2004 | Slater, Jr. et al. |
| 6,794,690 B2 | 9/2004 | Uemura |
| 6,812,502 B1 | 11/2004 | Chien et al. |
| 6,828,596 B2 | 12/2004 | Steigerwald et al. |
| 6,831,302 B2 | 12/2004 | Erchak et al. |
| 6,844,571 B2 | 1/2005 | Krames et al. |
| 6,853,010 B2 | 2/2005 | Slater, Jr. et al. |
| 6,900,472 B2 | 5/2005 | Kondoh et al. |
| 6,919,585 B2 | 7/2005 | Liu |
| 6,933,169 B2 | 8/2005 | Shibata et al. |
| 6,992,334 B1 | 1/2006 | Wierer, Jr. et al. |
| 7,009,214 B2 | 3/2006 | Yang et al. |
| 7,023,020 B2 | 4/2006 | Uemura |
| 7,148,520 B2 | 12/2006 | Yoo |
| 7,166,870 B2 | 1/2007 | Erchak et al. |
| 7,196,348 B2 | 3/2007 | Nakahara |
| 7,335,920 B2 | 2/2008 | Denbaars et al. |
| 7,345,315 B2 | 3/2008 | Hon et al. |
| 7,453,098 B2 | 11/2008 | Lai et al. |
| 7,501,023 B2 | 3/2009 | Dmitriev et al. |
| 7,514,720 B2 | 4/2009 | Kim et al. |
| 7,541,621 B2 | 6/2009 | Kurahashi et al. |
| 2002/0123164 A1 | 9/2002 | Slater, Jr. et al. |
| 2002/0137243 A1 | 9/2002 | Chen et al. |
| 2002/0163007 A1 | 11/2002 | Matsumoto et al. |
| 2003/0015721 A1 | 1/2003 | Slater, Jr. et al. |
| 2003/0111667 A1 | 6/2003 | Schubert |
| 2003/0146445 A1 | 8/2003 | Hen |
| 2004/0056254 A1 | 3/2004 | Bader et al. |
| 2004/0062284 A1 | 4/2004 | Jewell |
| 2004/0066820 A1 | 4/2004 | Johnson et al. |
| 2004/0164314 A1 | 8/2004 | Nakahara |
| 2005/0082558 A1 | 4/2005 | Yang et al. |
| 2005/0169336 A1 | 8/2005 | Ishii et al. |
| 2005/0236632 A1* | 10/2005 | Lai et al. .................. 257/94 |
| 2006/0002442 A1 | 1/2006 | Haberern et al. |
| 2006/0054909 A1 | 3/2006 | Shin et al. |
| 2006/0163586 A1 | 7/2006 | Denbaars et al. |
| 2007/0096110 A1 | 5/2007 | Kato et al. |
| 2007/0121690 A1 | 5/2007 | Fukii et al. |

FOREIGN PATENT DOCUMENTS

| | | |
|---|---|---|
| DE | 4338187 A1 | 5/1995 |
| DE | 197 45 723 A1 | 12/1998 |
| DE | 198 17 368 A1 | 12/1998 |
| EP | 0 911 887 A2 | 4/1999 |
| EP | 0 929 109 A1 | 7/1999 |
| EP | 1 416 543 A1 | 5/2004 |
| GB | 2280061 A | 1/1995 |
| JP | 1 295469 | 11/1989 |
| JP | 2-78280 (A) | 3/1990 |
| JP | 2-181980 A | 7/1990 |
| JP | 3 089568 | 4/1991 |
| JP | 5 235408 | 9/1993 |
| JP | 6-029570 | 2/1994 |
| JP | 7-094778 A | 4/1995 |
| JP | 7-147428 | 6/1995 |
| JP | 8-167738 | 6/1996 |
| JP | 8-213649 | 8/1996 |
| JP | 8-222797 | 8/1996 |
| JP | 8-250768 | 9/1996 |
| JP | 8-288550 | 11/1996 |
| JP | 9-074221 | 3/1997 |
| JP | H10-242516 A | 9/1998 |
| JP | H10-303502 A | 11/1998 |
| JP | 11-40854 | 2/1999 |
| JP | 11-186607 A | 7/1999 |
| JP | H11-177135 A | 7/1999 |
| JP | 11-251627 | 9/1999 |
| JP | 2000-261029 | 9/2000 |
| JP | 2000-294837 | 10/2000 |
| JP | 2001-68728 | 3/2001 |
| JP | 2001-77414 A | 3/2001 |
| JP | 2001-085742 | 3/2001 |
| JP | 2001-111103 A | 4/2001 |
| JP | 2001-291899 A | 10/2001 |
| JP | 2002-064221 | 2/2002 |
| JP | 2003-8055 | 1/2003 |
| JP | 2003-017742 | 1/2003 |
| JP | 2003-017748 A | 1/2003 |
| JP | 2003-037285 | 2/2003 |
| JP | 2003-110138 | 4/2003 |
| JP | 2003-174196 A | 6/2003 |
| JP | 2003-224299 A | 8/2003 |
| JP | 2003-532298 A | 10/2003 |
| JP | 2003-347586 A | 12/2003 |
| JP | 2004-047760 | 2/2004 |
| JP | 2004-096130 A | 3/2004 |
| JP | 2004-165436 A | 6/2004 |
| JP | 2004-172189 A | 6/2004 |
| JP | 2004-193338 A | 7/2004 |
| JP | 2005-005557 | 1/2005 |
| JP | 2005-093485 A | 4/2005 |
| JP | 2006-502563 A | 1/2006 |
| TW | 461124 | 10/2001 |
| TW | 513820 | 12/2002 |
| TW | 200409378 | 6/2004 |
| WO | WO 03/058772 | 7/2003 |
| WO | WO 03/061021 | 7/2003 |
| WO | WO 2004/010509 A2 | 1/2004 |
| WO | WO-2005/117147 A1 | 12/2005 |
| WO | WO 2006/011936 A2 | 2/2006 |
| WO | WO 2006/036565 A2 | 4/2006 |

OTHER PUBLICATIONS

Examination Report dated May 6, 2008, from related Application No. 05 806 491.6-2222.

First Office Action and English Language Translation, Chinese Patent Application No. 200910224555.3, Mar. 19, 2012.

Fujii T. et al., "Increase in the extraction efficiency of GaN-based light-emitting diodes via surface roughening", *Applied Physics Letters*, vol. 84, No. 6, Feb. 9, 2004, pp. 855-857.

Haerle et al. "High brightness LEDs for general lighting applications Using the new ThinGaN™—Technology" phys. stat. sol. (a) 201(12):2736-2739 (Sep. 2004).

Huh, et al. "Improvement in light-output efficiency of InGaN/GaN multiple-quantum well light-emitting diodes by current blocking layer." *Journal of Applied Physics*, vol. 92, No. 5, pp. 2248-2250, Sep. 1, 2002.

International Search Report and Written Opinion of the International Searching Authority Corresponding to International Application PCT/US2005/010868; Dated: Aug. 17, 2006.

(56) References Cited

OTHER PUBLICATIONS

Invitation to Pay Additional Fees and, Where Applicable, Protest Fee corresponding to International Application No. PCT/US2008/002140, Mailed Jul. 4, 2008 (8 Pages).
Invitation to Pay Additional Fees, Annex to Form PCT/ISA/206—Communication Relating to the Results of the Partial International Search, PCT/US2005/010868, May 3, 2006.
Japanese Office Action Corresponding to Japanese Patent Application No. 2011-117143 with English language translation; Mailing Date: Jun. 5, 2013, 5 pp.
Japanese Office Action Corresponding to Japanese Patent Application No. 2011-117144 with English language translation; Mailing Date: Jun. 5, 2013, 5 pp.
Japanese Office Action Corresponding to Japanese Patent Application No. 2011-218965; Mailing Date: May 7, 2013; 4 Pages (Foreign Text Only).
Japanese Office Action Corresponding to Japanese Patent Application No. 2009-552684; Date of Mailing: Aug. 24, 2012; Foreign Text, 4 Pages, English Translation Thereof, 5 Pages.
Japanese Office Action Corresponding to Japanese Patent Application No. 2009-552684; Mailing Date: Jan. 20, 2012; 6 pages.
Korean Intellectual Property Office (KIPO) Notice of Preliminary Rejection (English Translation) Corresponding to Korean Patent Application No. 10-2006-7027948; Dated: Jun. 10, 2011; 14 Pages.
Lee et al. "Characteristics of Top-Surface-Emitting GaAs Quantum-Well Lasers" *IEEE Photonics Technology Letters* 2(9):686-688 (1990).
Lee, Young Bao. *"Research on High Performance GaN-Based UV-LED"*, Tokushima University, Sep. 2003.
Margalith et al., "Ion Implantation for Current Confinement in InGaN-based RCLEDs," *4th International Symposium on blue Laser and Light Emitting Diodes*, Mar. 2002.
Notice of Preliminary Rejection (6 pp.) with English language translation (5 pp.) thereof, Korean Application No. 10-2012-7014255, Sep. 10, 2012.
Notification of Transmittal of the International Search Report and the Written Opinion of the International Searching Authority, or the Declaration, International Search Report and Written Opinion of the International Searching Authority, PCT Application No. PCT/US2008/002140, Dec. 16, 2008.
Office Action dated Jan. 14, 2010 for Related U.S. Appl. No. 12/079,486.
Office Action dated: Sep. 15, 2008 from related U.S. Appl. No. 11/983,515.
Office Action from related U.S. Appl. No. 11/042,030, dated: Jan. 24, 2006.
Office Action from related U.S. Appl. No. 11/042,030, dated: Sep. 19, 2006.
Office Action from related U.S. Appl. No. 11/042,030, dated: Sep. 10, 2007.
Office Action of the IPO with English language translation, Taiwanese patent Application No. 094131846, Feb. 21, 2012.
Official Action corresponding to Japanese Patent Application No. 2007-519194 mailed on Apr. 1, 2011; 4 pages.
Official Action corresponding to Japanese Patent Application No. 2008-062736 mailed on Apr. 5, 2011; 4 pages.
Official Communication for European Application No. 05806491.6 dated Apr. 19, 2010.
Official Communication from related Europe Application No. 05806491.6, dated: Oct. 28, 2009.
Official Notice of Final Decision of Rejection of related Japanese Patent Application No. 2007-552114, dated: Jan. 30, 2009.
Official Notice of Rejection mailed on Jul. 18, 2008 for related Japanese Patent Application No. 2007-552114.
PCT International Preliminary Report, PCT/US05/36552, Date: Mar. 31, 2008.
Response to Related Office Action U.S Appl. No. 11/042,030, dated: Jan. 24, 2006, filed on Jun. 26, 2006.
Response to Related Office Action U.S. Appl. No. 11/042,030, dated: Sep. 10, 2007, filed on Oct. 5, 2007.
Response to Related Office Action U.S. Appl. No. 11/042,030, dated: Sep. 19, 2006, filed on Feb. 20, 2007.
Schnitzer et al., "30% External Quantum Efficiency From Surface Textured, Thin-Film Light-Emitting Diodes", *Appl. Phys. Letters* 63(16), Oct. 18, 1993, American Institute of Physics, pp. 2174-2176.
Streubel et al., "High Brightness AlGaInP Light-Emiting Diodes" *IEEE Journal on Selected Topics in Quantum Electronics*, vol. 8, No. 2, Mar./Apr. 2002, pp. 321-332.
Tadatomo et al. "High output power near-ultraviolet and violet light-emitting diodes fabricated on patterned sapphire substrates using metalorganic vapor epitaxy" *Proc. of SPIE* 5187:243-249 (Jan. 2004).
Taiwanese Office Action and English language translation thereof, Application No. 094112476, Oct. 22, 2012.
Thibeault et al. "Enhanced Light Extraction Through Integrated Microlens Arrays and Dispersive Elements", U.S. Appl. No. 60/168,817, Dec. 3, 1999.
Windisch et al., "Impact of Texture-Enhanced Transmission on High-Efficiency Surface-Textured Light-Emitting Diodes", *Applied Physics Letters*, vol. 79, No. 15, Oct. 8, 2001, pp. 2315-2317.
Windisch et al., "Light-Extraction Mechanisms in High-Efficiency Surface-Textured Light-Emitting Diodes", *IEEE Journal on Selected Topics in Quantum Electronics*, vol. 8, No. 2, Mar./Apr. 2002, pp. 248-255.
Yoo et al. "Fabrication of Vertical-Cavity Front-Surface-Emitting Laser Diode (FSELD) Using a Heterojunction Bipolar Transistor Process" *Japanese Journal of Applied Physics* 30(3B):L492-L494 (1991.

\* cited by examiner

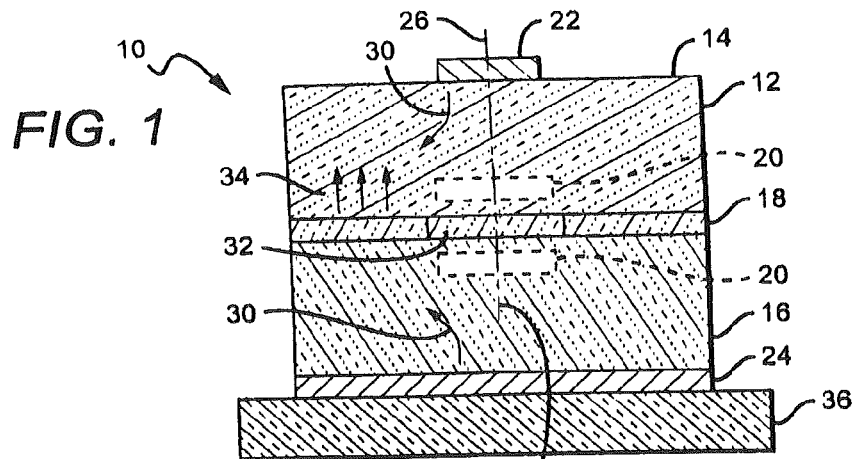
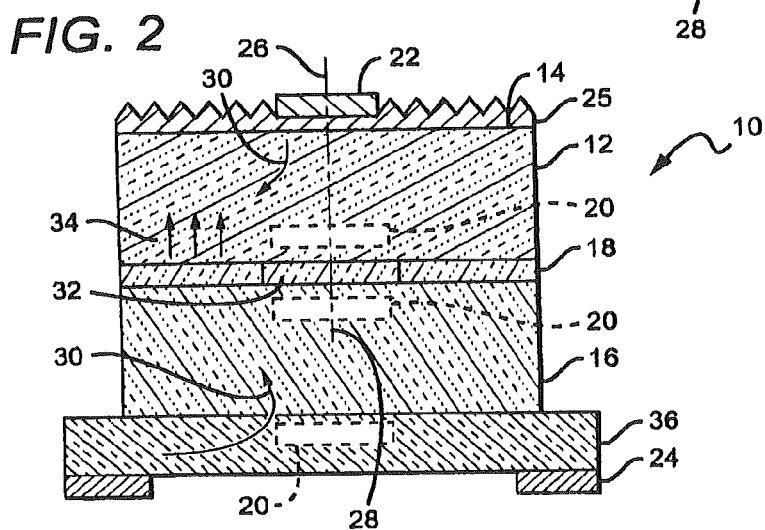
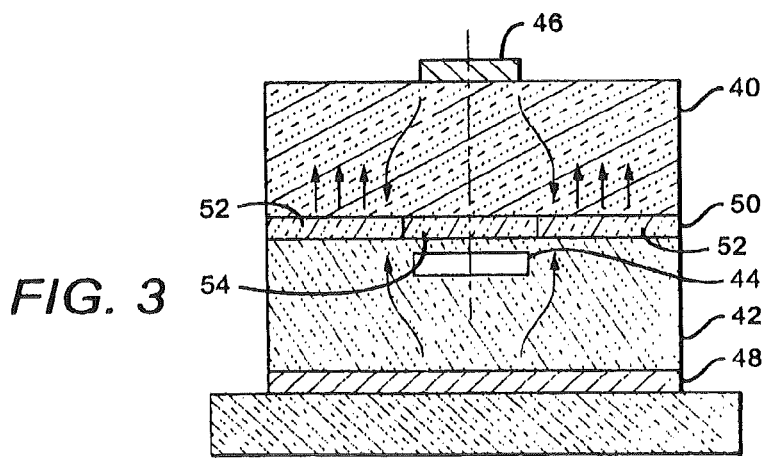

though the substrate. TIR can be caused by the large differ-
LED WITH SURFACE ROUGHENING The Present application is a continuation from U.S. patent application Ser. No. 12/581,759, filed on Oct. 19, 2009, which itself is a continuation application from, and claims the benefit of, U.S. patent application Ser. No. 11/983,515, filed on Nov. 9, 2007, now U.S. Pat. No. 8,410,490, which itself is a divisional application from, and claims the benefit of, U.S. patent application Ser. No. 11/042,030, filed on Jan. 24, 2005, and now issued as U.S. Pat. No. 7,335,920, the disclosures of all of which are hereby incorporated hereby by reference in their entirety as if set forth fully herein

BACKGROUND OF THE INVENTION

1. Field of the Invention

This invention relates to light emitting diodes (LEDs) and more particularly to new structures for enhancing the extraction of light from LEDs.

2. Description of Related Art

Light emitting diodes (LEDs) are an important class of solid state devices that convert electric energy to light and generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED.

There has been a great deal of recent interest in LEDs formed of Group-III nitride based material systems because of their unique combination of material characteristics including high breakdown fields, wide bandgaps (3.36 eV for GaN at room temperature), large conduction band offset, and high saturated electron drift velocity. The doped and active layers are typically formed on a substrate that can be made of different materials such as silicon (Si), silicon carbide (SiC), and sapphire ($Al_2O_3$). SiC wafers are often preferred because they have a much closer crystal lattice match to Group-III nitrides, which results in Group III nitride films of higher quality. SiC also has a very high thermal conductivity so that the total output power of Group III nitride devices on SiC is not limited by the thermal resistance of the wafer (as is the case with some devices formed on sapphire or Si). Also, the availability of semi insulating SiC wafers provides the capacity for device isolation and reduced parasitic capacitance that make commercial devices possible. SiC substrates are available from Cree Inc., of Durham, N.C. and methods for producing them are set forth in the scientific literature as well as in U.S. Pat. Nos. Re. 34,861; 4,946,547; and 5,200,022.

The efficient extraction of light from LEDs is a major concern in the fabrication of high efficiency LEDs. For conventional LEDs with a single out-coupling surface, the external quantum efficiency is limited by total internal reflection (TIR) of light from the LED's emission region that passes through the substrate. TIR can be caused by the large difference in the refractive index between the LED's semiconductor and surrounding ambient. LEDs with SiC substrates have relatively low light extraction efficiencies because the high index of refraction of SiC (approximately 2.7) compared to the index of refraction for the surrounding material, such as epoxy (approximately 1.5). This difference results in a small escape cone from which light rays from the active area can transmit from the SiC substrate into the epoxy and ultimately escape from the LED package.

Different approaches have been developed to reduce TIR and improve overall light extraction, with one of the more popular being surface texturing. Surface texturing increases the light's escape probability by providing a varying surface that allows photons multiple opportunities to find an escape cone. Light that does not find an escape cone continues to experience TIR, and reflects off the textured surface at different angles until it finds an escape cone. The benefits of surface texturing have been discussed in several articles. [See Windisch et al., *Impact of Texture-Enhanced Transmission on High-Efficiency Surface Textured Light Emitting Diodes*, Appl. Phys. Lett., Vol. 79, No. 15, October 2001, Pgs. 2316-2317; Schnitzer et al. *30% External Quantum Efficiency From Surface Textured, Thin Film Light Emitting Diodes*, Appl. Phys. Lett., Vol 64, No. 16, October 1993, Pgs. 2174-2176; Windisch et al. *Light Extraction Mechanisms in High-Efficiency Surface Textured Light Emitting Diodes*, IEEE Journal on Selected Topics in Quantum Electronics, Vol. 8, No. 2, March/April 2002, Pgs. 248-255; Streubel et al. *High Brightness AlGaNInP Light Emitting Diodes*, IEEE Journal on Selected Topics in Quantum Electronics, Vol. 8, No. March/April 2002].

U.S. Pat. No. 6,410,942, assigned to Cree Inc., discloses an LED structure that includes an array of electrically interconnected micro LEDs formed between first and second spreading layers. When a bias is applied across the spreaders, the micro LEDs emit light. Light from each of the micro LEDs reaches a surface after traveling only a short distance, thereby reducing TIR.

U.S. Pat. No. 6,657,236, also assigned to Cree Inc., discloses structures for enhancing light extraction in LEDs through the use of internal and external optical elements formed in an array. The optical elements have many different shapes, such as hemispheres and pyramids, and may be located on the surface of, or within, various layers of the LED. The elements provide surfaces from which light refracts or scatters.

SUMMARY OF THE INVENTION

Briefly, and in general terms, the invention is directed to LEDs having enhanced light extraction features. In one aspect of the invention, the LED includes a p-type layer of material with an associated p-contact, an n-type layer of material with an associated n-contact and an active region between the p-type layer and the n-type layer. The LED further includes a confinement structure that is formed within at least one of the p-type layer of material and the n-type layer of material. The confinement structure substantially prevents the emission of light from the area of the active region that is coincident with the area of the confinement structure. The LED also includes a roughened surface that is associated with one of the p-type and n-type layers of material.

In another aspect of the invention, the LED includes a first layer of material with an associated first contact and first surface through which light is emitted, a second layer of material with an associated second contact and an active region between the first layer and the second layer. The LED further includes a confinement structure that is integral with one of the first layer and the second layer. The confinement structure is generally axially aligned with the first contact and substantially prevents the emission of light in the area of the active region that is coincident with the area of the confinement structure.

In yet another aspect of the invention, the LED includes a first layer of material with an associated first contact and first surface through which light is emitted, a second layer of material, an active region between the first layer and the second layer, and a conducting substrate adjacent the second layer of material that has an associated substrate contact. The LED further includes at least one confinement structure that is within one of the first layer, the second layer and the substrate. The confinement structure is generally axially aligned with the first contact and directs current flowing toward the active region away from the area of the active region that is coincident with the area of the confinement structure.

In still another aspect of the invention, the LED includes a first layer of material with an associated first contact and first surface through which light is emitted, a second layer of material with an associated second contact and an active region between the first layer and the second layer. The LED further includes a confinement structure that is associated with the second contact. The confinement structure directs current flowing toward the active region away from the area of the active region that is coincident with the area of the confinement structure.

These and other aspects and advantages of the invention will become apparent from the following detailed description and the accompanying drawings which illustrate by way of example the features of the invention.

BRIEF DESCRIPTION OF THE DRAWINGS

FIG. 1 is a cross section of one general embodiment of an LED including an active region between two layers of conducting material and a current confinement structure that may be located in either layer of the conducting material;

FIG. 2 is a cross section of another general embodiment of an LED including an active region between two layers of conducting material, a substrate, a roughened top surface and a current confinement structure that may be located in either layer of the conducting material or a substrate;

FIG. 3 is a cross section of a configuration of the LED of FIG. 1, including a current confinement structure in a bottom layer of n-type material;

DETAILED DESCRIPTION OF THE PREFERRED EMBODIMENTS

Figure 4:
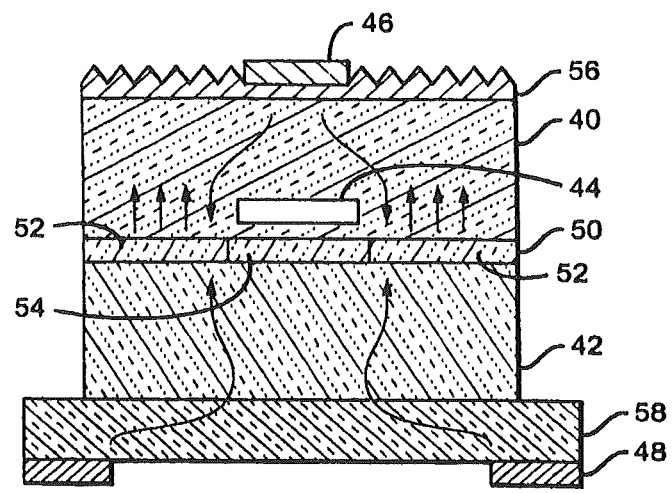
FIG. 4 is a cross section of a configuration of the LED of FIG. 2, including a current confinement structure in a top layer of p-type material and a layer of transparent conducting material having a roughened top surface.

The present invention provides improved light extraction for light emitting diodes (LEDs) through a confinement structure that is formed within at least one of the p-type layer of material and the n-type layer of material of a base LED structure. The confinement structure is generally aligned with the contact on the top and primary emission surface of the LED and substantially prevents the emission of light from the area of the active region that is coincident with the area of the confinement structure and the top-surface contact. Thus, light that would otherwise emit under and be absorbed by the top-surface contact is redirected to other regions of the active layer and the emitting side where the absorbing affect of the contact is substantially reduced. In a preferred embodiment, the current confinement structure is formed within the based LED structure using ion implantation. The current confinement structure may also be formed in the LED base structure using selective oxidation. The current confinement structure may also be formed as part of the LED structure using epitaxial regrowth.

The LED may further include a roughed surface around the absorbing contact. The roughened surface may be included in all or a portion of the surface area of a layer of the base LED structure or in all or a portion of the surface area of an additional layer of material applied to the base LED structure. For example, in an n-side up LED structure having a sufficiently thick n-type layer of material it may be preferable to roughen the n-type layer. In a p-side up base LED structure having a relatively thin layer of p-type material, it may be preferable to add a layer of transparent material to the p-type layer and roughen that layer. A layer of transparent material may also be added to the n-type layer of an n-side up LED structure. In either case, the combination of a roughened surface and current confinement structure that directs current toward the roughened surface and away from the absorbing contact provides further enhanced light extraction. The roughened surface improves light extraction by providing a varying surface that allows light that would otherwise be trapped in the LED by total internal reflection to escape and contribute to light emission.

Referring now to the drawings and particularly to FIGS. 1 and 2, there is shown one embodiment of an LED 10 according to the present invention, including a first layer of material 12 having a first surface 14 through which light is emitted, a second layer of material 16, and a layer of active material 18 sandwiched between the first layer and the second layer. The first layer 12, second layer 16 and active layer 18 form a base LED structure that is positioned on a support structure 36.

The base LED structure may be fabricated from different semiconductor material systems such as the Group III nitride based material systems. Group III nitrides refer to those semiconductor compounds formed between nitrogen and the elements in the Group III of the periodic table, usually aluminum (Al), gallium (Ga), and indium (In). The term also refers to ternary and tertiary compounds such as AlGaN and AlInGaN. In a preferred embodiment, the layer of active material 18 is in adjacent contact with the first layer 12 and the second layer 16, and the material forming the first and second layers is GaN, with either of the first or second layers being p-type material and the other layer being n-type material. In this embodiment, the material forming the active layer is InGaN. In alternative embodiments the first and second layer material may be AlGaN, AlGaAs or AlGaInP.

Depending on the LED configuration, the support structure 36 which may be a substrate or a submount. In a p-side up LED configuration, the support structure 36 would be a substrate, with a suitable substrate being a 4H polytype of silicon carbide, although other silicon carbide polytypes can also be used including 3C, 6H and 15R polytypes. Silicon carbide has a much closer crystal lattice match to Group III nitrides than sapphire and results in Group III nitride films of higher quality. Silicon carbide also has a very high thermal conductivity so that the total output power of Group III nitride devices on silicon carbide is not limited by the thermal dissipation of the substrate (as may be the case with some devices formed on sapphire). Also, the availability of silicon carbide substrates provides the capacity for device isolation and reduced parasitic capacitance that make commercial devices possible. SiC substrates are available from Cree, Inc., of Durham, N.C. and methods for producing them are set forth in the scientific literature as well as in a U.S. Pat. Nos. Re. 34,861; 4,946,547; and 5,200,022. For an n-side up LED configuration, the support structure 36 would be a submount.

A first contact 22 is associated with the first layer 12 and a second contact 24 is associated with the second layer 16. The association of the contacts 22, 24 with their respective layers 12, 16 may be direct or indirect. A direct association, wherein the first contact is in direct contact with the first layer 12 and the second contact 24 is in direct contact with the second layer 16, is shown in FIG. 1. For the second contact 24, this association may be present when the substrate 36 is formed of a non-conducting material. Indirect associations are shown in FIG. 2 and may be present, with respect to the first contact 22, if the LED includes a layer of transparent conducting material 25, and for the second contact 24, if the support structure 36 is a substrate formed of a conducting material. To enhance light extraction in both direct and indirect contacting, the second contact may be formed of a reflective material, such as silver (Ag), aluminum (Al) or rhodium (Rh).

A current confinement structure 20 is integral with and can be formed in different location within the LED, such as within at least one of the first layer 12, the second layer 16 or the substrate 36 (as shown in FIG. 2). In some embodiments, more than one current confinement structure may be used and in one embodiment the current confinement structure 20 may be formed in both the first layer 12 and the second layer 16 with a portion of the active material 18 between the confinement structures 20. In some embodiments, the confinement structure 20 may be a region of the layer of material whose crystal structure or molecular properties have been altered through processes known in the art, such as ion implantation or oxidation. In other embodiments, the confinement structure 20 may be a current blocking layer formed from a material that is oppositely doped relative to the material of the first or second layers 12, 16. This current blocking layer of material may be incorporated into one or more of the first and second layers through the known process of epitaxial regrowth.

The current confinement structure 20 is positioned relative to the first contact 22 such that the center 26 or axis of the first contact is generally aligned with the center or axis 28 of the confinement structure. The cross-sectional area size of the confinement structure 20 essentially mirrors that of the first contact 22. The thickness of the current confinement structure 20 may range anywhere from between 0.1% to 80% of the total thickness of the layer. For example, in an n-type layer of material 1 micron thick, the current confinement structure 20 may be between 0.001 and 0.8 microns thick.

The current confinement structure 20 directs current 30 that is flowing toward the active region 18 away from the portion 32 of the active region that is substantially coincident with and aligned with the first contact 22. This redirection of current substantially prevents the recombination of current charges, i.e., "holes" and "electrons," in the portion 32 of the active region aligned with the first contact 22, thus essentially rendering the region inactive.

Light 34 is emitted from the active material 18 and propagates through the LED structure. Although, light emits from the active material 18 in all directions, for ease of illustration, light in the figures is shown only in the upward direction toward the top or primary emission surface of the LED. In FIG. 1, the top surface is the surface 14 of the top layer of material 12. In FIG. 2, the top surface is a layer of roughened material 25.

With reference to FIG. 3, one embodiment of the general LED of FIG. 1 according to the present invention is shown comprising a p-side up LED that includes a first layer 40 of p-type material and a second layer 42 of n-type material. In a preferred embodiment, the material is GaN. As explained further below, during the LED manufacturing process, the current confinement structure 44 is incorporated into the n-type material layer 42. The structure 44 is formed by introducing impurities into the n-type material. The introduction of impurities may be done by ion implantation. For example, for an n-type GaN material, either Al or Ga ions may be implanted.

Upon the application of a bias across the p-contact 46 and the n-contact 48, current (in the form of p-type material "hole" movement) moves through the p-type material toward and into the active region. Likewise, current (in the form of n-type material "electron" movement) moves through the n-type material 42 toward and into the active region 50. Due to the impurities of the confinement structure 44, the current moving through the n-type material 42 moves away from the current confinement structure and enters the active region 50 in the area 52 around the inactive portion 54 of the active region that is substantially coincident with and aligned with the current confinement structure. This area of the active region is referred to as the active portion 52 of the active region.

The current moving through the p-type material 40 also moves away from the current confinement structure 44 and into the areas of the active region where the current from the n-type material has entered. This movement of the p-type material current is a result of a combination of both the presence of the current confinement structure 44 in the n-type material and the attraction of the p-type current "holes" to the n-type current "electrons" present in the active portion 52 of the active region 50.

The current confinement structure 44 may be positioned at any one of several locations along the depth of the n-type layer 42. This may be done by interrupting the growth process of the n-type layer 42, implanting the impurities into the incomplete n-type layer and then resuming the growth process to complete the rest of the n-type layer. The growth process may be any one of various known processes including metal oxide chemical vapor deposition (MOCVD), hybrid vapor phase epitaxy (HVPE) or molecular beam epitaxy (MBE). An exemplary confinement structure formation process includes implanting the n-layer with 180 keV aluminum ions in doses of $10^{33}$, $10^{14}$ and $10^{15}$ cm$^{-2}$. In a preferred embodiment, the current confinement structure 44 is located close to active region 50 to effectively prevent n-type current from moving completely around the current confinement structure and back toward the inactive region 54, and to increase the affect of the structure on the current in the p-type layer on the opposite side of the active region 50.

With reference to FIG. 4, another embodiment of the general LED 10 of FIG. 2 according to the present invention is shown comprising a p-side up LED that is essentially the same as that described with reference to FIG. 3, except the current confinement structure 44 is located in the p-type layer 40. Also, the substrate 58 is conducting thus allowing for an indirect association between the n-contact 48 and the n-type layer 42. A layer of transparent conducting material 56 is included on the p-type layer 40 with a portion of the conducting material layer sandwiched between the p-contact 46 and the p-type layer. This layer of material may be formed from ZnO, In$_2$O$_3$ and indium tin oxide (ITO). At least part of the conducting material layer 56 not covered by the p-contact 46 is roughened, with all of the top surface of the conducting material layer as shown in FIG. 4 being roughened. The combination of the layer of transparent conducting material 56 and localized light generation away from the absorbing contact 46, provided by the current confinement structure 44, increases the light extraction efficiency of the LED.

Figure 5:
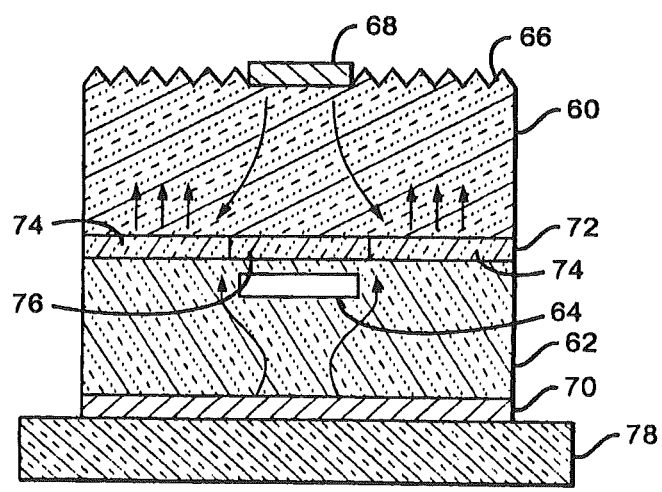
FIG. 5 is a cross section of a configuration of the LED of FIG. 1, including a current confinement structure in a bottom layer of p-type material and a layer of n-type material having a roughened top surface.

With reference to FIG. 5, another embodiment of the general LED 10 of FIG. 1 is shown, comprising an n-side up, flip-chip LED that includes a first layer 60 of n-type material and a second layer 62 of p-type material. As an additional processing step, the substrate which is typically adjacent to the first n-type layer 60 is removed to reveal the top primary emitting surface of the LED.

In a preferred embodiment, the LED material is GaN. During the LED manufacturing process, the current confinement structure 64 is incorporated into the p-type material layer 62 prior to flipping layers 60, 62, 64 and p-contact substructure onto a submount 78. The confinement structure 64 is formed by introducing impurities into the p-type material by ion implantation during growth. For example, for a p-type GaN material, either Al or Ga ions may be implanted. The top surface 66 of the n-type layer is roughened to form a roughened light extraction surface. The roughened surface may be provided by etching, using any one of several methods known in the art, such as photoelectrochemical (PEC) etching. In this configuration, the roughened surface is added directly to the n-type layer instead of through a separately added layer of transparent conducting material, as is typically required for p-side up LEDs, due to the relative thinness of the p-layer.

Upon the application of a bias across the n-contact 68 and the p-contact 70, current moves through the p-type material toward and into the active region 72. Likewise, current moves through the n-type material 60 toward and into the active region 72. The current moving through the p-type material 62 moves away from the current confinement structure 64 and enters the active region 72 in the active portion 74 around the inactive portion 76. The current moving through the n-type material 60 also moves away from the current confinement structure 64 and into the active portion 74 of the active region.

Figure 6:
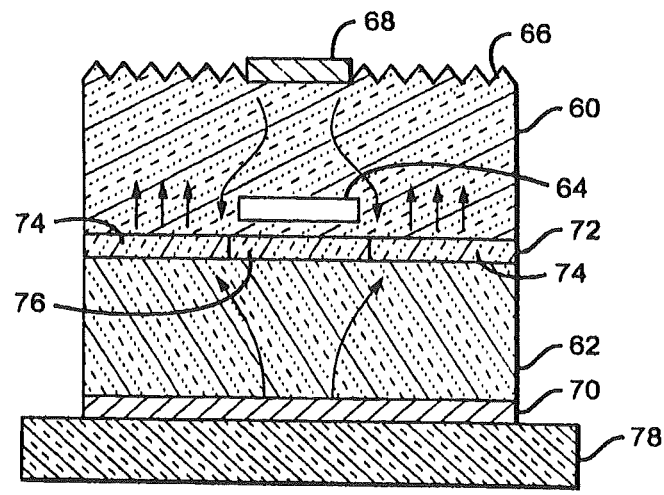
FIG. 6 is a cross section of a configuration of the LED of FIG. 1, including a current confinement structure in a top layer of n-type material and a layer of n-type material having a roughened top surface.

As with the embodiment of FIG. 3, the current confinement structure 64 may be positioned at various locations along the depth of the p-type layer 62 by interrupting the growth process of the p-type layer, implanting the impurities into the incomplete p-type layer and then resuming the growth process to complete the layer. In a preferred embodiment, the current confinement structure 64 is located close to active region 72 to effectively prevent p-type current from moving completely around the current confinement structure and back toward the inactive region 76, and to increase the affect of the structure on the current in the n-type layer on the opposite side of the active region 72. With reference to FIG. 6, in another embodiment, the general LED of FIG. 1 is an n-side up LED that is essentially the same as that described with reference to FIG. 5, except the current confinement structure 64 is located in the n-type layer 60.

Figure 7:
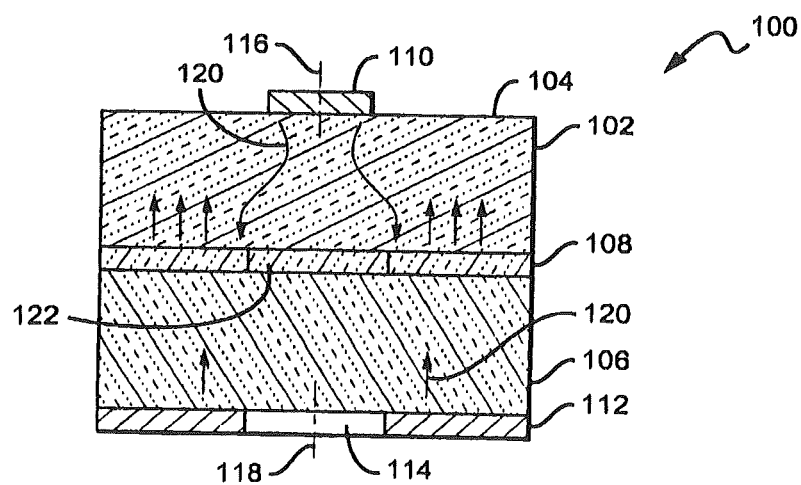
FIG. 7 is a cross section of another general embodiment of an LED including an active region between two layers of conducting material, a top side contact, a bottom side contact and a current confinement structure located in the layer of the bottom side contact.

Referring now to FIG. 7 there is shown an LED 100 including a first layer of material 102 having a first surface 104 through which most of the light is emitted, a second layer of material 106 and a layer of active material 108 sandwiched between the first layer and the second layer. In a preferred embodiment, the layer of active material 108 is in adjacent contact with the first layer 102 and the second layer 106, and the material forming the first and second layers is GaN and the material forming the active layer is InGaN. In alternative embodiments the first and second layer material may be AlGaN, AlGaAs or AlGaInP.

A first contact 110 is associated with the first layer 102 and a second contact 112 is associated with the second layer 106. A current confinement structure 114 is included in the layer of the second contact 112 and is positioned relative to the first contact 110 such that the center 116 or axis of the first contact is generally aligned with the center or axis 118 of the confinement structure. The layer of the second contact 112 and the confinement structure 114 is formed by depositing a layer of contact material, etching away a portion of the layer of contact material and replacing it with the material of the confinement structure. The confinement structure 114 is formed of an insulating, non-conducting material, such as $SiO_2$, AlN and SiN, and has a cross-sectional area size essentially the same as that of the first contact 110.

The current confinement structure 114 directs current 120 that is flowing toward the active region 108 away from the portion 122 of the active region that is substantially coincident with and aligned with the first contact 110. This redirection of current substantially prevents the recombination of current charges, i.e., "holes" and "electrons," in the portion 122 of the active region aligned with the first contact 110, thus essentially rendering the region inactive.

As with the embodiments described with reference to FIGS. 3 through 6, the general LED of FIG. 7 may be formed such that the first layer 102 is either one of an n-type layer or a p-type layer and the second layer 106 is a type of layer opposite that of the first layer. The LED 100 may also include a surface roughening, either in the form of a roughened top surface of the first layer 102 or an additional layer of transparent conducting material having a roughened top surface.

It will be appreciated by those of skill in the art that the concepts of the invention, as described in the embodiments of FIGS. 1-7, may be incorporated into other LED configurations. For example, while the LEDs of FIGS. 1-7 have contacts in a vertical arrangement, i.e., on opposite sides of the LED, the invention may be applied to LEDs having, laterally arranged contacts, i.e., on the same side of the LED, such as resonant cavity LEDs.

It will be apparent from the foregoing that while particular forms of the invention have been illustrated and described, various modifications can be made without departing from the spirit and scope of the invention. Accordingly, it is not intended that the invention be limited, except as by the appended claims.

We claim:

1. A light emitting diode (LED) comprising:
 a first layer of first conductivity type having an associated first contact;
 a second layer of second conductivity type having an associated second contact;
 an active region between the first and second layers; and
 a layer comprising transparent conductive material between the first layer and the first contact and extending on the first layer beyond the first contact, the layer comprising transparent material having a first face adjacent the first layer and a second face remote from the first layer, the second face being smooth beneath the first contact and at least a portion of the second face being rough beyond the first contact.

2. The LED of claim 1 wherein the transparent conductive material comprises a transparent conductive oxide.

3. The LED of claim 2 wherein the transparent conductive oxide comprises ZnO, $In_2O_3$ or Indium Tin Oxide (ITO).

4. The LED of claim 1 wherein the second contact comprises reflective material.

5. The LED of claim 1 wherein the first conductivity type is p-type and the second conductivity type is n-type.

6. The LED of claim 5 further comprising a semiconductor substrate on the second layer remote from the active region.

7. The LED of claim 1 wherein the first conductivity type is n-type and the second conductivity type is p-type.

8. The LED of claim 7 further comprising a submount on the second layer remote from the active region.

9. The LED of claim 1 wherein the first layer, second layer and active region comprise Group III nitride materials.

10. The LED of claim 1 wherein the first and second contacts are laterally arranged on a same side of the LED.

11. A light emitting diode (LED) comprising:
a first layer of first conductivity type having an associated first contact;
a second layer of second conductivity type having an associated second contact;
an active region between the first and second layers; and
a layer comprising transparent conductive material between the first layer and the first contact and extending on the first layer beyond the first contact, the layer comprising transparent material having a first face adjacent the first layer and a second face remote from the first layer, the first contact having a first face adjacent the first layer and a second face remote from the first layer, wherein the second face of the layer comprising transparent conductive material extends further away from the first layer than the first face of the first contact.

12. The LED of claim 11 wherein the transparent conductive material comprises a transparent conductive oxide.

13. The LED of claim 12 wherein the transparent conductive oxide comprises ZnO, $In_2O_3$ or Indium Tin Oxide (ITO).

14. The LED of claim 11 wherein the second contact comprises reflective material.

15. The LED of claim 11 wherein the first conductivity type is p-type and the second conductivity type is n-type.

16. The LED of claim 15 further comprising a semiconductor substrate on the second layer remote from the active region.

17. The LED of claim 11 wherein the first conductivity type is n-type and the second conductivity type is p-type.

18. The LED of claim 17 further comprising a submount on the second layer remote from the active region.

19. The LED of claim 11 wherein the first layer, second layer and active region comprise Group III nitride materials.

20. The LED of claim 11 wherein the first and second contacts are laterally arranged on a same side of the LED.

21. The LED of claim 11 wherein the second face of the layer comprising transparent conductive material is smooth beneath the first contact and at least a portion of the second face of the layer comprising transparent conductive material is rough beyond the first contact.

* * * * *